United States Patent [19]

Sarin

[11] Patent Number: 4,965,140
[45] Date of Patent: Oct. 23, 1990

[54] COMPOSITE COATINGS ON REFRACTORY SUBSTRATES

[75] Inventor: Vinod K. Sarin, Lexington, Mass.

[73] Assignee: GTE Laboratories Incorporated, Waltham, Mass.

[21] Appl. No.: 206,401

[22] Filed: Jun. 14, 1988

Related U.S. Application Data

[63] Continuation-in-part of Ser. No. 5,003, Jun. 14, 1988, Pat. No. 4,751,109.

[51] Int. Cl.$^5$ .............................................. B32B 9/00
[52] U.S. Cl. ..................................... 428/698; 428/325; 428/334; 428/404; 428/688; 428/689; 428/699; 428/704
[58] Field of Search ............... 428/698, 699, 688, 472, 428/689, 704, 404, 332, 334, 325

[56] References Cited

U.S. PATENT DOCUMENTS

| | | | |
|---|---|---|---|
| Re. 29,420 | 9/1977 | Lindstrom et al. | 428/336 |
| Re. 31,526 | 2/1984 | Smith et al. | 75/235 |
| Re. 32,093 | 3/1986 | Hale | 428/336 |
| Re. 32,111 | 4/1986 | Lambert et al. | 428/212 |
| 3,249,460 | 5/1966 | Gerry | 117/70 |
| 3,306,768 | 2/1967 | Peterson | 427/255.3 |
| 3,511,703 | 5/1970 | Peterson | 427/255.3 |
| 3,836,392 | 9/1974 | Lux et al. | 117/169 R |
| 3,914,473 | 10/1975 | Hale | 427/255 |
| 3,955,038 | 5/1976 | Lindstrom et al. | 428/457 |
| 3,967,035 | 6/1976 | Hale | 428/336 |
| 3,977,061 | 8/1976 | Lindstrom et al. | 29/95 R |
| 4,018,631 | 4/1977 | Hale | 148/31.5 |
| 4,019,873 | 4/1977 | Reiter | 428/217 |
| 4,101,703 | 7/1978 | Schintlmeister | 428/216 |
| 4,112,148 | 9/1978 | Fonzi | 427/255.3 |
| 4,150,195 | 4/1979 | Tobioka et al. | 428/548 |
| 4,282,289 | 8/1981 | Kullander et al. | 428/457 |
| 4,341,965 | 7/1982 | Okuo et al. | 428/698 |
| 4,399,168 | 8/1983 | Kullander et al. | 428/698 |
| 4,441,894 | 4/1984 | Sarin et al. | 428/698 |
| 4,463,033 | 7/1984 | Kikuchi et al. | 427/255.3 |
| 4,463,062 | 7/1984 | Hale | 428/698 |
| 4,497,874 | 2/1985 | Hale | 428/551 |
| 4,525,415 | 6/1985 | Poral | 428/698 |
| 4,539,251 | 9/1985 | Sugisawa et al. | 428/698 |
| 4,576,836 | 3/1986 | Colmet et al. | 427/255.3 |
| 4,588,655 | 5/1986 | Kushner | 428/633 |
| 4,609,562 | 9/1986 | Isenberg et al. | 427/255.3 |
| 4,619,865 | 10/1986 | Keem et al. | 428/333 |
| 4,619,866 | 10/1986 | Smith et al. | 428/336 |
| 4,629,661 | 12/1986 | Hillert et al. | 428/698 |
| 4,643,951 | 2/1987 | Keem et al. | 428/469 |
| 4,645,715 | 2/1987 | Ovshinsky et al. | 428/698 |
| 4,695,517 | 9/1987 | Okuno et al. | 428/698 |
| 4,701,384 | 10/1987 | Sarin et al. | 428/688 |
| 4,702,970 | 10/1987 | Sarin et al. | 428/688 |
| 4,731,303 | 3/1988 | Hirano et al. | 428/698 |
| 4,745,010 | 5/1988 | Sarin et al. | 427/255 |
| 4,749,629 | 6/1988 | Sarin et al. | 428/698 |
| 4,800,137 | 1/1989 | Ohuno et al. | 428/698 |

OTHER PUBLICATIONS

U.S. Patent Application Ser. No. 07/114,984, filed 10/30/88 by Sarin et al., A Divisional Application of U.S. Pat. No. 4,749,629.

Primary Examiner—Patrick J. Ryan
Assistant Examiner—Archene A. Turner
Attorney, Agent, or Firm—Frances P. Craig

[57] ABSTRACT

A wear resistant article, such as a cutting tool. A hard refractory substrate is coated with a composite refractory coating having at least two phases. The first phase is a continuous nitride matrix layer 0.1–20 microns thick of nitrides of Si, B, Al, Y, Ti, Zr, Hf, V, Nb, Ta, Mo, or W. At least one discontinuous second or additional phase of nitrides of Si, B, Al, Y, Ti, Zr, Hf, V, Nb, Ta, Mo, or W, or solid solutions thereof, is dispersed as discrete particles within the matrix layer. The additional phase material is different from the matrix material.

10 Claims, 1 Drawing Sheet

COMPOSITE COATINGS ON REFRACTORY SUBSTRATES

REFERENCE TO RELATED APPLICATIONS

This application is a continuation-in-part of U.S. patent application Ser. No. 005,003, which as U.S. Pat. No. 4,751,109 on June 14, 1988, and which is incorporated herein by reference.

This application is also related to U.S. patent application Ser. No. 07/206,399, filed concurrently herewith, and incorporated herein by reference.

THE FIELD OF THE INVENTION

This invention relates to a coated refractory article, and more particularly to such an article having a two or more phase composite refractory coating deposited.

BACKGROUND OF THE INVENTION

Hard refractory materials are known and are used extensively in such applications as mining tool bits, metal cutting, milling, and boring tools, metal drawing dies, wear-resistant machine parts and the like. It is also known that the service properties such as wear, high temperature and chemical resistance of such materials may be enhanced by the application of one or more thin coatings of, for example, metal carbides, metal nitrides, or ceramics to the hard refractory substrate.

"Hard refractory," as used herein, refers to fully dense, wear resistant materials not melting or dissociating below 1000° C., for example ceramic compositions based on $Al_2O_3$, $Si_3N_4$, SiC, silicon aluminum oxynitride, and related materials; cemented metal carbides such as WC-Co; and metal carbides, nitrides, and carbonitrides, such as TiC and TiN. Such materials may have a monolithic or composite microstructure.

Great strides have been made in improved performance of these coated substrates, for example in machining applications, by refinement of the substrate compositions and by applying simple layers or various combinations of superimposed layers of coating materials. However, increasingly stringent use conditions, for example use at high cutting speeds or in extremely high temperatures and/or corrosive environments, are placing increasing demands upon the performance of such materials.

The invention described herein and recited in the appended claims provides a process for depositing a wear resistant composite coating of controlled composition and distribution on a hard refractory substrate to produce an article showing improved abrasion resistance under extreme conditions of use.

SUMMARY OF THE INVENTION

A wear resistant article according to the invention comprises a hard refractory substrate body and a fully dense, adherent, wear resistant, composite refractory layer on the substrate body. The composite refractory layer has at least two phases and includes a continuous nitride layer about 0.1-20 microns thick. The nitride layer comprises at least one first refractory nitride of Si, B, Al, Y, Ti, Zr, Hf, V, Nb, Ta, Mo, or W. The composite refractory layer also includes at least one discontinuous additional phase dispersed as discrete particles within the nitride layer. The additional phase comprises at least one second refractory nitride of Si, B, Al, Y, Ti, Zr, Hf, V, Nb, Ta, Mo, or W. The at least one second refractory nitride is different from the at least one first refractory nitride.

BRIEF DESCRIPTION OF THE INVENTION

For a better understanding of the present invention, together with the objects, advantages, and capabilities thereof, reference is made to the following disclosure and appended claims, taken together with the drawings, of which:

FIGS. 1 and 2 are schematic cross-sectional illustrations of coated articles according to the invention.

DETAILED DESCRIPTION OF THE INVENTION

Figure 1:
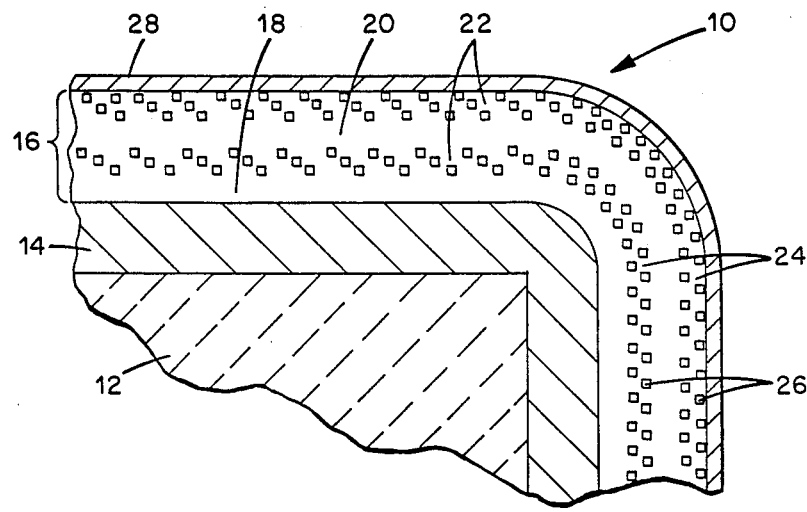

The coated articles according to the present invention are produced by deposition of an adherent two or more phase composite nitride-based coating layer on a hard refractory substrate, as described above.

A process for depositing the wear resistant refractory layer on a hard refractory substrate to produce the article according to the invention involves passing over the substrate a first gaseous mixture comprising a first halide vapor selected from the group consisting of halides of Si, B, Al, Y, Ti, Zr, Hf, V Nb, Ta, Mo and W, and one or more volatile nitriding gases, at a temperature between about 800° C and a temperature detrimental to the substrate properties, at a pressure between about 1 torr and about ambient pressure, and at partial pressure ratios, at a flow rate, and for a time sufficient to deposit a continuous, fully dense, adherent, wear resistant layer comprising at least one refractory nitride of Si, B, Al, Y, Ti, Zr, Hf, V, Nb, Ta, Mo, or W about 0.1-20 microns thick on the substrate. At least one additional vapor selected from the halides of Si B, Al, Y, Ti, Zr, Hf, V, Nb, Ta, Mo, and W is mixed with the first gaseous mixture to form a second gaseous mixture. The additional vapor is different from the first halide vapor, and is mixed at a partial pressure selected to form at least one discontinuous additional phase, dispersed as discrete particles within the continuous nitride layer. The discontinuous phase comprises at least one refractory nitride of Si, B, Al, Y, Ti, Zr, Hf, V, Nb, Ta, Mo, or W. A fully dense, adherent, wear resistant, composite refractory layer is thus deposited on the substrate.

The co-deposition of a two or more phase nitride-based composite coating which possesses the properties of adherence to the substrate, wear resistance, high temperature resistance, and resistance to chemical attack or breakdown at high temperatures depends on careful control of the process parameters. The outstanding properties of the coating are a result of the achievement of a second phase of discrete particles of a nitride of Si, B, Al, Y, Ti, Zr, Hf, V, Nb, Ta, Mo, or W, or a combination of these, within matrix of a nitride of Si, B, Al, Y, Ti, Zr, Hf, V, Nb, Ta, Mo, or W. For example, preferred coating layers include zirconium nitride and/or yttrium nitride particles within a continuous aluminum nitride matrix, yttrium nitride particles within a continuous zirconium nitride matrix, zirconium nitride particles within a continuous yttrium nitride matrix, titanium nitride particles within continuous silicon nitride or aluminum nitride matrix. The particles may be evenly distributed throughout the matrix, or their distribution may be controlled to achieve, for example, a stratified structure of single-phase nitride matrix portions alternating with two or more phase matrix/particle portions, preferably distributed at controlled intervals throughout the depth of the matrix. Similarly, the deposition may be controlled to deposit a single-phase continuous portion of controlled depth of the matrix material below the two or more phase portion or the alternating singlephase/two or more phase portion of the coating.

The process involves the use of a mixture of gases including a mixture of two or more metal halides and other reactant gases under carefully controlled conditions to deposit by chemical vapor deposition (CVD) compounds of the metals on a substrate. The metal halides preferably are produced by passing halide gas or gases over the metals, for example metal particulates. For example, the metals may be combined as a mixture of metals, as a metal alloy, or as metal salts. A single halide gas is passed over the combined metals to form a mixture of metal halides. Alternatively, at least the metal forming the matrix is separate, and separate halide gas streams are passed over the metals to form separate metal halides, which are later combined. Carrier gases, for example Ar, may be combined with the halide gases. Preferred metal halide gases are chlorides of Si, B, Al, Y, Ti, Ze, Hf, V, Nb. These are combined with suitable other gases such as $H_2$ and $N_2$ or other volatile nitriding gases such as $NH_3$. One or more of the metals may be advantageously contained in a separate vessel within the CVD reactor, as described in the U.S. patent application Ser. No. 07/206,400.

Further control over the deposition process may be achieved by pulsing the metal halide gas forming the second phase or phases while maintaining continuous flow of the metal halide gas forming the matrix. This pulsing method may also be used to control the distribution of the second phase within the matrix, for example to achieve either an even distribution or a stratified distribution as described above.

Likewise, a single metal halide gas may be allowed to flow, with the other reactant gases, for a period of time sufficient to deposit a continuous single-phase portion of the material comprising the matrix, before the two-phase portion or alternating single-phase/two or more phase portion of the coating is deposited.

Some examples of composite coatings according to the invention are: AlN matrix/ZrN particles, ZrN matrix/YN particles, YN matrix/ZrN particles, AlN matrix/YN particles, AlN matrix/TiN particles, AlN matrix/ZrN particles and YN particles and $Si_3N_4$ matrix/TiN particles.

The terms second phase and two-phase as used herein refer to composites comprising a first phase, continuous nitride matrix compound and one or more additional or second phases which may be a single compound or more than one compound, in the form of discrete particles. The matrix and/or particles may be nitrides of a single metal or a solid solution of nitrides of more than one metal, and the individual particles maybe of the same or different compounds. The particles disclosed herein may be regularly shaped, as spheres, rods, whiskers, etc., or irregularly shaped.

The nitrides as described herein may also conveniently include oxygen, i.e. as oxynitrides of Si, B, Al, Y, Ti, Ar, Hf, V, Nb, Ta, Mo, or W, in the first and additional phases. Such oxynitrides may be achieved by the inclusion of a suitable oxygen source in the reactant gases, for example NO or $NO_2$. An example of composite refractory oxynitride coatings according to the invention is: Si—Al—O—N matrix/Ti(O,N) particles.

The composite coatings according to the invention are fully dense, adherent, and make it possible to combine the wear resistant properties of two or more components without the problems associated with differences in expansion coefficients and adhesion presented by layering of continuous coatings of the materials.

The refractory coating layers described herein may be combined with other refractory coating layers. For example, further improvement in the adhesion of the coating to the substrate may be achieved by depositing between the composite coating and the substrate a thin intermediate layer of TiC, TaC, Ti(C,N), or other carbide, nitride or carbonitride of Ti, Zr, Hf, Va, Nb, Ta, Cr, Mo, W, Al, Si, or B. Such deposition may be achieved in known manner as a preliminary part of the same coating process or in a separate, prior coating process. Similarly, for special applications, for example friction, cosmetic, wear or thermal purposes, a thin outer layer such as TiN may be applied in known manner over the composite coating.

Figure 2:
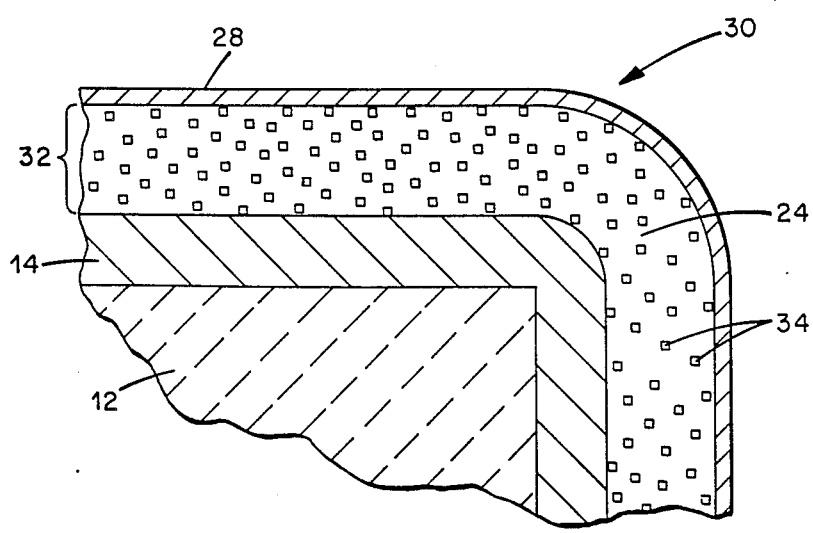

FIGS. 1 and 2, not drawn to scale, schematically illustrate typical coated articles 10 and 30 according to the invention. As shown in FIG. 1, substrate 12 is a shaped cemented WC material, and may be a cutting tool or other article requiring wear resistance under the extreme conditions described above. A thin layer 14 of TiC covers the substrate, at least in the area subjected to wear. Composite layer 16 is deposited over TiC layer 14, and is made up of single-phase matrix portions 18 and 20 of AlN, and two-phase portions 22 of an AlN matrix 24 and discrete particles 26 of ZrN. As shown in FIG. 1, there is no separation between the AlN of matrix 24 of two-phase portions 22 and that of single-phase matrix portions 18 and 20. The AlN of the composite coating is a single continuous matrix having a co-deposited second phase of controlled composition and distribution dispersed therein. An outer layer 28 of TiN is deposited over the composite layer, giving article 10 a distinctive identifying color.

FIG. 2 illustrates an alternate embodiment of the article according to the invention. Like features in the two figures are identified by the same reference numerals. In FIG. 2, substrate 12 is overlaid with thin TiC layer 14 in the same manner as shown in FIG. 1. Composite layer 32 is deposited over TiC layer 14, and is made up of AlN matrix 24 with particles 34 of YN evenly distributed throughout matrix 24. Outer layer 28 of TiN is deposited over the composite layer.

The following Examples are presented to enable those skilled in this art to more clearly understand and practice the present invention. These Examples should not be considered as a limitation upon the scope of the invention, but merely as being illustrative and representative thereof.

EXAMPLE 1

After rinsing of all gas lines with their respective gases for 0.5–1 hr, cutting tool inserts of a cemented carbide material, steel cutting grade C-5, were coated with a layer of TiC about 3 microns thick by known techniques in a CVD reactor. The reactor was evacuated to about 10 torr, then heated under low pressure, while being flushed with flowing hydrogen, to increase the outgassing before deposition.

The metal halide gases were chlorides, the carrier gas for the $AlCl_3$ and $ZrCl_4$ reactions was Ar, and the nitriding reactant gas was $NH_3$ with $H_2$ as a carrier. The gas flow rates are shown in the Table below. The deposition pressure for Example 1, was about 0.75 torr; the temperature, about 1025° C. A period of AlN deposition (single-phase) was carried out before the two-phase AlN/ZrN deposition was begun.

Following the deposition procedure, the reactor was cooled, at the deposition pressure and while being flushed with hydrogen, to about 300° C., then under ambient pressure and flowing nitrogen to room temperature.

The thickness of the coatings was 4-6mm, as measured by the abrasive ball method (Calotest) and scanning electron microscope. The chemical composition of the coating was determined by x-ray diffraction analysis. The coating was deposited on the TiC underlayer as a stratified composite of alternating aluminum nitride and aluminum nitride/zirconium nitride portions over a single-phase aluminum nitride portion, similar to that illustrated in FIG. 1, but without the TiN layer over the nitride coating. The nitride coating and the TiC underlayer show satisfactory thickness and good adherence.

EXAMPLE 2

The process of Example 1 is repeated for Example 2 to coat the same type of TiC coated cemented carbide cutting tool inserts, except that both $AlCl_3$ and $ZrCl_4$ are flowing during the entire co-deposition period. The deposition pressure and temperature are 100 torr and 1000° C. respectively. The remaining reaction conditions are given in the Table below. The resulting composite coatings are similar to that illustrated in FIG. 2, except that no TiN layer is deposited over the nitride coating. The coating is a continuous AlN matrix with ZrN particles distributed therein. No single phase portion was deposited below the two phase portion of the nitride layer.

TABLE

| | Flow Rate ccpm | | | | | $AlCl_3$ | $ZrCl_4$ |
|---|---|---|---|---|---|---|---|
| Ex. | $H_2$ | Ar | $NH_3$ | $AlCl_3$ | $ZrCl_4$ | flow | flow |
| 1 | 4300 | 3000 | 705 | 72 | 8 | 120 min | 5 min per each 20 min |
| 2 | 4300 | 3000 | 705 | 72 | 8 | 120 min | 120 min |

While there has been shown and described what are at present considered the preferred embodiments of the invention, it will be obvious to those skilled in the art that various changes and modifications can be made therein without departing from the scope of the invention as defined in the appended claims.

I claim:

1. A wear resistant article comprising a hard refractory substrate body and a fully dense, adherent, wear resistant, composite refractory layer on the substrate body, the composite refractory layer having at least two phases and comprising:
   a continuous nitride layer about 0.1-20 microns thick comprising at least one first refractory nitride of Si, B, Al, Y, Ti, Zr, Hf, V, Nb, Ta, Mo, or W; and
   at least one discontinuous additional phase dispersed as discrete particles within the nitride layer, and comprising at least one second refractory nitride of Si, B, Al, Y, Ti, Zr, Hf, V, Nb, Ta, Mo, or W;
   wherein the at least one second refractory nitride is different from the at least one first refractory nitride.

2. An article according to claim 1 wherein the additional phase is substantially evenly dispersed within the continuous nitride layer.

3. An article according to claim 1 wherein the composite refractory layer is a stratified layer in which portions having at least two phases alternate with single phase continuous nitride portions.

4. An article according to claim 1 wherein the first refractory nitride comprises AlN and the second refractory nitride comprises ZrN.

5. An article according to claim 1 wherein the first refractory nitride comprises ZrN and the second refractory nitride comprises YN.

6. An article according to claim 1 wherein the first refractory nitride comprises YN and the second refractory nitride comprises ZrN.

7. An article according to claim 1 wherein the first refractory nitride comprises $Si_3N_4$ and the second refractory nitride comprises TiN.

8. An article according to claim 1 wherein the first refractory nitride comprises AlN and the second refractory nitride comprises TiN.

9. An article according to claim 1 wherein the at least one additional phase comprises the at least one second refractory nitride and at least one third refractory nitride of Si, B, Al, Y, Ti, Zr, Hf, V, Nb, Ta, Mo, or W.

10. An article according to claim 1 wherein the first refractory nitride comprises AlN, the second refractory nitride comprises ZrN, and the third refractory nitride comprises YN.

* * * * *